United States Patent [19]

Krumme et al.

[11] Patent Number: 5,044,980
[45] Date of Patent: Sep. 3, 1991

[54] HIGH DENSITY AND MULTIPLE INSERTION CONNECTOR

[75] Inventors: John F. Krumme, Del Mar; Gary Yasumura, Santa Clara, both of Calif.

[73] Assignee: Beta Phase, Inc., Menlo Park, Calif.

[21] Appl. No.: 465,982

[22] Filed: Jan. 16, 1990

[51] Int. Cl.$^5$ ............................................. H01R 9/07
[52] U.S. Cl. .................... 439/496; 439/933; 439/67
[58] Field of Search ............ 439/62, 67, 77, 492–499, 439/636, 637, 833, 839, 933

[56] References Cited

U.S. PATENT DOCUMENTS

| | | | |
|---|---|---|---|
| 3,102,767 | 9/1963 | Schneck | 339/176 |
| 3,154,365 | 10/1964 | Crimmins | 439/496 |
| 3,319,216 | 5/1967 | McCullough | 439/493 |
| 3,401,369 | 9/1968 | Palmateer et al. | 339/17 |
| 3,772,775 | 11/1973 | Bonnke et al. | 439/67 |
| 3,792,418 | 2/1974 | Kailus | 439/933 |
| 4,784,615 | 11/1988 | Teng-Hong | 439/496 |
| 4,815,990 | 3/1989 | Ristedt et al. | 439/496 |
| 4,826,446 | 5/1989 | Juntwait | 439/326 |
| 4,881,908 | 11/1989 | Perry et al. | 439/161 |
| 4,911,643 | 3/1990 | Perry et al. | 439/493 |

FOREIGN PATENT DOCUMENTS 2441712  4/1975  Fed. Rep. of Germany ...... 439/495

Primary Examiner—Larry I. Schwartz
Assistant Examiner—Hien D. Vu
Attorney, Agent, or Firm—Burns, Doane, Swecker & Mathis

[57] ABSTRACT

A high density and multiple insertion connector that minimizes the amount of friction created by coupling and uncoupling of the connector wherein a generally hourglass-shaped insertion member isolates sliding contact between the components to surfaces of low frictional resistance material during the majority of the insertion and removal movements while providing wiping and high contact forces between electrical contacts.

10 Claims, 2 Drawing Sheets

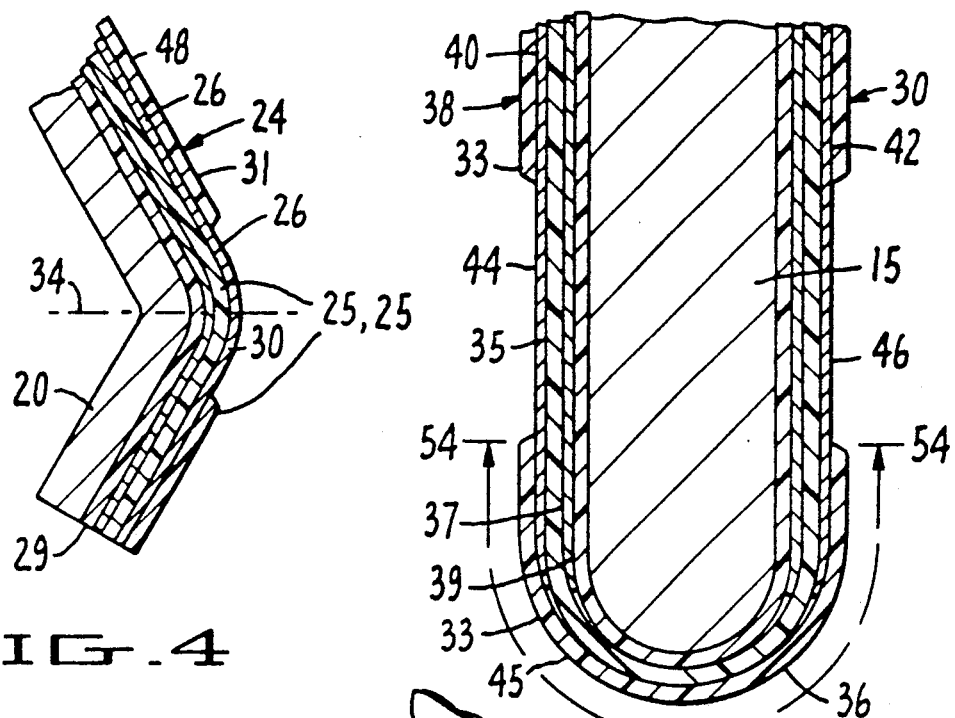
FIG. 4
FIG. 5
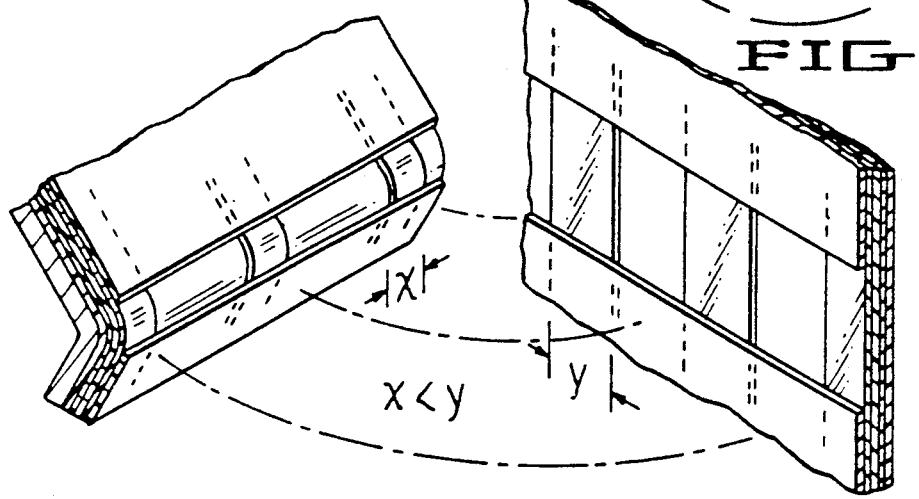
FIG. 6
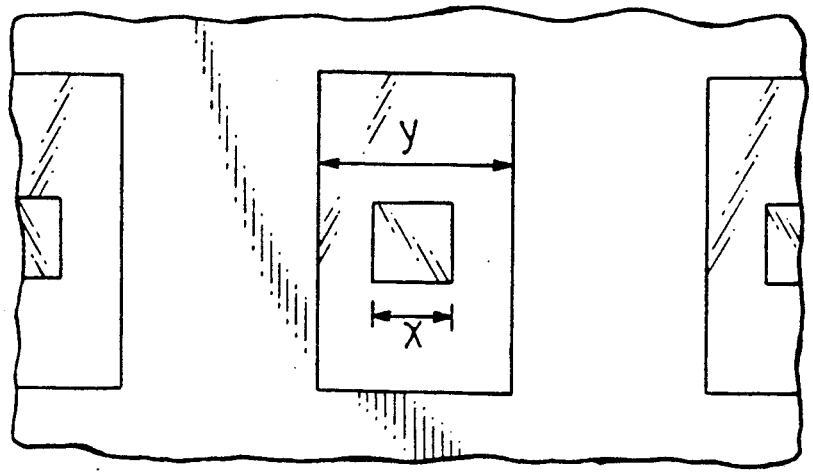
FIG. 7

HIGH DENSITY AND MULTIPLE INSERTION CONNECTOR

BACKGROUND OF THE INVENTION

1. Field of the Invention

The invention relates to high density electrical connectors and specifically to low insertion force connectors that are specially suited for repetitive coupling and uncoupling.

2. Prior Art

Interconnection of electronic devices such as integrated circuits and printed circuit boards becomes increasingly difficult as the number of contacts increases and as the number of times the insertion and removal of the devices increases. As the number of contacts increases, the alignment and the cleanliness of the contacting surfaces becomes more critical. As the number of interconnections increases, the potential for wear and/or damage to the connector through mating and de-mating becomes greater.

It is commonly known to insert a circuit board into connectors having individual, spring-loaded retaining contacts in order to provide a removable connection. As the number of contacts increases, the amount of force required to overcome the cumulative resistance of the corresponding number of sockets becomes so great that the potential for damage to either the connector or the circuit board becomes far more likely. The insertion and removal force encountered is generally borne by the surfaces that are in rubbing contact during the manipulative step. For example, in U.S. Pat. No. 4,826,446 to Juntwait, individual contact pins having spaced flexible contact arms are adapted to receive and to be flexed apart by an electrical component, such as a printed circuit card, that is inserted and pivoted therein. Although the connector significantly reduces the amount of force needed for insertion, the normal forces at the point of contact on the contact arms and on the card nonetheless eventually cause wear upon each insertion and removal of the card.

U.S. Pat. No. 3,102,767 to Schneck discloses an electrical connector for flat conductor cable where the cable is wrapped around a U- or channel-shaped spring. The dielectric coating of the cable is stripped to expose the conductor ribbons which are forced into contact with component boards upon insertion between the arms of the spring. The forces of insertion and removal in this device are endured by the conductors and the contact circuitry on the surface of the component boards. U.S. Pat. No. 3,319,216 to McCullough discloses a similar structure wherein multiconductor cable and a printed circuit board are in rubbing contact with each other upon insertion and removal of the board.

U.S. Pat. No. 3,401,369 to Palmateer et al. discloses a laminated connector which includes a sheet of dielectric material and a plurality of electrical contact members for using printed circuit techniques. As can be seen in FIG. 5 of that reference, the contact pressure between the laminate and the member inserted therein is focused on conductive members on the insertion member and on contact buttons on the laminate. Such a construction will have limited multiple insertion and removal life. To overcome problems of alignment and insertion force, electrical connectors have been developed which use mechanical actuation to close (or open) contacts and to maintain a mechanical retaining force. Such devices are generally complex and bulky. More sophisticated actuation mechanisms using shape-memory alloy actuators have also been developed in which remote electrical actuation of the connector is provided.

None of the above-discussed connectors provides a concept for a simple, manually-operated, low insertion force, high density, multiple insertion connector with independent two-sided contact and contact wiping for a wide range of connector configurations, such as those discussed above, including connectors which provide for remote electrical actuation.

SUMMARY OF THE INVENTION

The purpose of the invention is to provide a high density, low insertion force connector design that minimizes the amount of friction created by insertion and withdrawal of a male portion with respect to a female portion while simultaneously providing wiping and high contact force between electrical contacts on each portion in a variety of overall connector configurations. To accomplish this purpose there is provided a connector having a female portion with a generally C-shaped biasing member and flexible circuitry mounted about the biasing member. The circuitry has electrical contacts positioned near and slightly spaced from the ends of the biasing member, the flexible circuitry near the electrical contacts generally having a sliding surface. The connector also includes a male portion having an insertion member insertable within the flexible circuitry, the male portion having contacts positioned adjacent to but spaced from the edge of the insertion member and also generally having sliding surfaces above and below the contacts, the sliding surfaces contacting each other and being made from materials which minimize the amount of friction created upon contact by repeated insertion and withdrawal of the insertion member relative to the flexible circuitry. Further insertion movement of the insertion member provides wiping and positioning of all of the contacts of both portions into mating position.

In one aspect of the invention there is provided a high density multiple insertion connector comprising:

a biasing member, said biasing member being elongated and having a longitudinal opening along the length thereof, said biasing member being generally C-shaped and having a center portion and arm portions having ends;

flexible circuitry having first and second sets of parallel-spaced electrical conductors, at least a portion of said flexible circuitry mounted about said biasing member, said electrical conductors terminating in first and second sets of electrical contacts, said first set of contacts positioned on one side of said opening and said second set of contacts positioned on the other side of said opening, said first and second sets of electrical contacts positioned within the opening near but slightly spaced from the ends of said arm portions, the flexible circuitry near said first and second sets of electrical contacts having a first sliding surface, said biasing member and said flexible circuitry defining a female portion of the connector; and an insertion member, said insertion member being elongated and having a longitudinal edge for insertion into said opening, said insertion member having additional flexible circuitry on the surface thereof including third and fourth sets of parallel-spaced conductors, said third and fourth sets of conductors positioned on each side of said insertion member, said third and fourth sets of electrical conductors terminating in third and fourth sets of electrical contacts positioned adjacent to but spaced from the edge of said insertion member, the flexible circuitry near said third and fourth sets of electrical contacts having a second sliding surface, said first and second sliding surfaces being made of low friction material such that insertion or removal of the insertion member causes contact between said first and second surfaces, overcoming the bias of said biasing member to widen the opening further for insertion or withdrawal of the insertion member, said first and second surfaces undergoing a minimum of friction created by insertion and removal of the insertion member, further insertion movement of the insertion member positioning and wiping the contacts of said first, second, third, and fourth sets of electrical contacts with respect to each other into mating position, the insertion member defining a male portion of the connector.

DESCRIPTION OF THE DRAWING

FIG. 3 is a partial enlarged view of the mating portions of the insertion member and the flexible circuitry including the ends of the biasing member.

FIG. 4 is a partial cross-sectional view of the contact area of one side of the female portion of the connector of the invention illustrating the arm portion of the biasing member and the typical layered construction of the flexible circuitry.

FIG. 5 is a partial cross-sectional view similar to FIG. 4 of the contact area of one side of the male portion of the connector of the invention illustrating the typical layered construction of the flexible circuitry.

FIG. 6 is a partial rotated view of one side of the male and female portions of the connector illustrating the contact zones of each portion which allow for alignment mismatch.

FIG. 7 is a partial view perpendicular to the contact zones of the male and female portions of the connector illustrating the relative preferred widths of the contacts.

DESCRIPTION OF THE PREFERRED EMBODIMENTS

Figure 1:
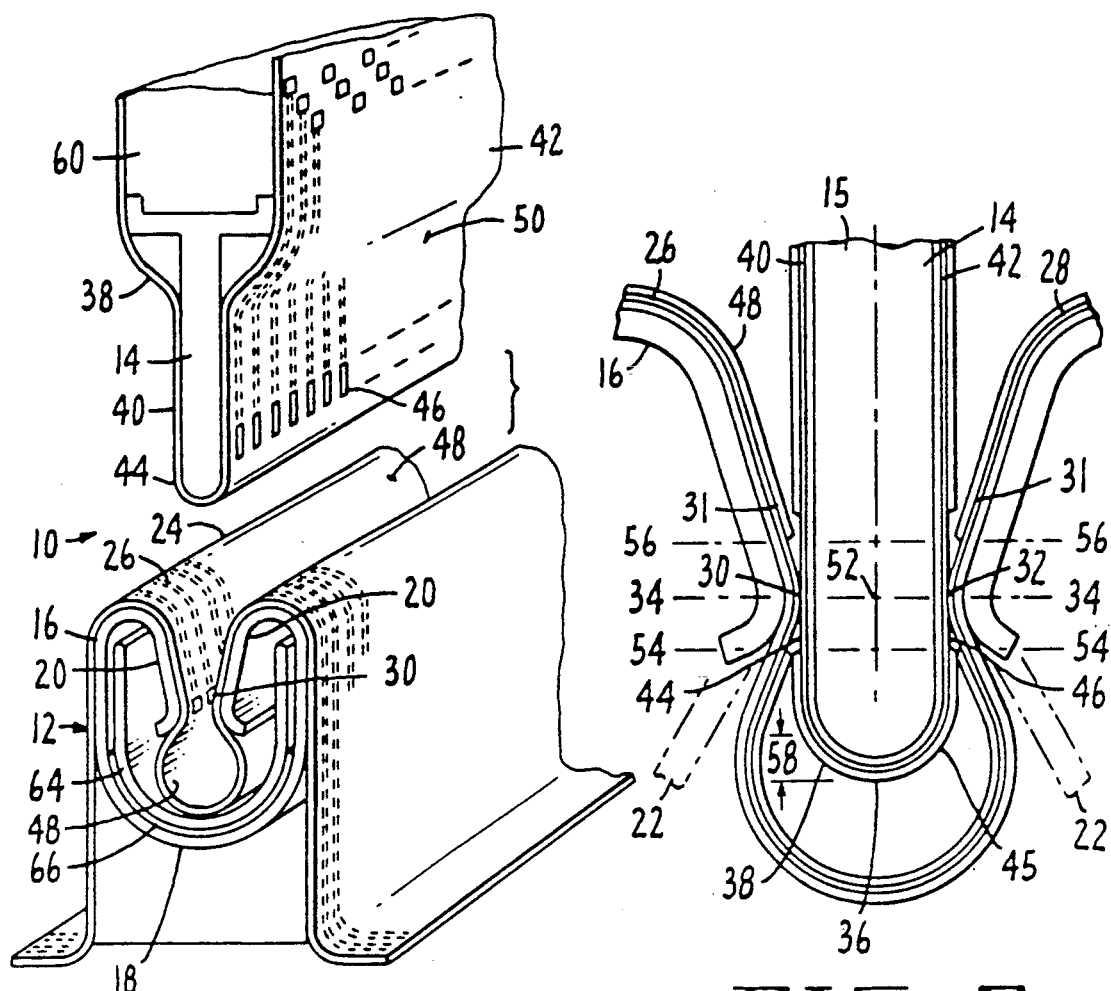
FIG. 1 is an exploded partial perspective view of the connector of the invention with the insertion member positioned prior to insertion. The Figure also illustrates an optional shape-memory alloy element and heater positioned within the biasing member to provide remote electrical actuation for true zero insertion force if desired.

With continued reference to the drawing, FIG. 1 illustrates a high density multiple insertion connector, shown generally at 10. Connector 10 includes a female portion 12 and a male portion 14, each portion having a high density of generally parallel-spaced electrical conductors terminating in contacts.

Female portion 12 includes biasing member 16 which is elongated and has a longitudinal opening along the length thereof, biasing member 16 being generally C-shaped and having a center portion 18 and arm portions 20 terminating in the opening. Biasing member 16 is made from spring material, preferably beryllium copper or other suitable materials.

Biasing member 16 is shown to have arm portions 20 which extend within the overall C-shape of biasing member 16. As seen in FIG. 3 in phantom line, it is within the scope of the invention to have alternative arm portions 22 which extend only outwardly rather than inwardly. In such an embodiment, alternative arm portions 22 extend outwardly and curve at the ends thereof to likewise accommodate the bending of flexible circuitry which would hang over the ends of the arm portions in drape-like fashion. It is further within the scope of the invention to have connector configurations with female portion biasing members of various configurations of arm members, lengths, and angular orientations so long as such arm portions and the flexible circuitry mounted thereon are moved by insertion of a male portion to connect or disconnect the two portions of the connector.

Female portion 12 also includes flexible circuitry 24 having first and second sets of parallel-spaced electrical conductors 26 and 28, respectively, at least a portion of flexible circuitry 24 being mounted about biasing member 16. A typical layered construction of flexible circuitry 24 is shown in FIG. 4, which will be described later in further detail. It is understood that it is within the scope of the invention to use various constructions of flexible circuitry mounted about biasing member 16. As shown in FIGS. 1 and 3, first and second sets of parallel-spaced electrical conductors 26 and 28, respectively, are mounted about arm portions 20. The individual conductors of first and second sets of parallel-spaced electrical conductors 26 and 28, respectively, are oriented generally perpendicular to the opening in biasing member 16.

The electrical conductors of first and second sets of parallel-spaced electrical conductors 26 and 28, respectively, terminate in first and second sets of electrical contacts 30 and 32, respectively, the first set of electrical contacts 30 positioned on one side of said opening, and the second set of electrical contacts 32 positioned on the other side of the opening, said first and second sets of electrical contacts 30 and 32, respectively, positioned within the opening near but slightly spaced from the ends of said arm portions 20. The area of flexible circuitry 24 near the contacts, especially above the electrical contacts (taken along the line of insertion) is defined as first sliding surface 31. In FIG. 3, the approximate center of contact for first and second sets of electrical contacts 30 and 32, respectively, is generally dissected by a plane having a center line 34. It can be seen that center line 34 is near but slightly spaced from the ends of arm portions 20.

Male portion 14 of connector 10 comprises an insertion member 15, insertion member 15 being elongated and having a longitudinal edge 36 for insertion into the opening of female portion 12. Insertion member 15 has flexible circuitry 38 on the surface thereof including third and fourth sets of parallel-spaced electrical conductors 40 and 42, respectively. Third and fourth sets of parallel-spaced electrical conductors 40 and 42, respectively, are also oriented perpendicular to the opening. Third and fourth sets of parallel-spaced electrical conductors 40 and 42, respectively, are complementary with first and second sets of parallel-spaced electrical conductors 26 and 28, respectively. Positioned on each side of insertion member 15, third and fourth sets of parallel-spaced electrical conductors 40 and 42, respectively, terminate in third and fourth sets of electrical contacts 44 and 46, respectively. Third and fourth sets of electrical contacts 44 and 46, respectively, are positioned adjacent to but spaced from longitudinal edge 36 of insertion member 15. Flexible circuitry 38 has a second sliding surface 45 near third and fourth sets of electrical contacts 44 and 46, respectively, which can clearly be seen in FIG. 5, each of at least the first and second sliding surfaces 31 and 45, respectively, of the flexible circuitries 24 and 38 having a layer of similar dielectric and low friction material on the outsides thereof in the defined areas which rub against each other upon insertion and removal movement of the connector portions.

In FIGS. 3, 4 and 5, flexible circuitry 24 of female portion 12 and flexible circuitry 38 of male portion 14 include layers 25, 33, and 35 of dielectric material, such as Kapton TM, having first and second sets of parallel-spaced electrical conductors 26 and 28, respectively, and third and fourth sets of parallel-spaced electrical conductors 40 and 42, respectively, insulated therein.

In FIG. 4, the preferred layered structure of flexible circuitry 24 is shown in cross-section mounted on biasing member 16. First and second sets of parallel-spaced electrical conductors 26 and 28, respectively, are preferably made from copper with the contact zones plated with nickel and followed by gold on the surface. Layers of dielectric material 25 are positioned over and under first set of parallel-spaced electrical conductors 26; a portion of the outer layer of dielectric material 25, especially above the electrical contacts, comprises first sliding surface 31. Copper ground plane 27 is positioned below inside layer of dielectric material 25 and is attached to biasing member 16 by adhesive layer 29.

It is understood that it is within the scope of the invention to use types of flexible circuitry other than that described above with respect to both the male and female portions of the connector.

In FIGS. 1, 3 and 5, the preferred layered structure of flexible circuitry noted generally at 38 is mounted on insertion member 15 which is made of aluminum, liquid crystal polymer, stainless steel, or polyether-ether-ketone. Third and fourth sets of electrical contacts 44 and 46, respectively, have a gold surface with a nickel-plated barrier over copper conductors 40 and 42 which are sandwiched between layers of dielectric material 33 and 35 such as those used for layers of dielectric material 25. Outer layer of dielectric material 33 in the area especially noted at second sliding surface 45 comprises second sliding surface 45. It can be seen that second sliding surface 45 essentially surrounds third and fourth sets of electrical contacts 44 and 46, respectively, with layer of dielectric material 33 on each side of third and fourth sets of electrical contacts 44 and 46, respectively. Copper ground plane 37 is positioned below layer of dielectric material 35 and is attached to insertion member 15 by adhesive layer 39.

Although first and second sliding surfaces 31 and 45, respectively, disclosed are made of Kapton TM, it is understood that these surfaces may be made of any low friction material, including Teflon TM.

With continued reference to FIG. 3, upon insertion of male portion 14, outer surface 45 below center line 54 (earlier defined as second sliding surface 45) contacts the outside layer 48 of female portion 12 above center line 56 (earlier defined as first sliding surface 31). It can be seen that further movement of the generally bulbous-shaped male portion 14 spreads the arm portions 20 and causes sliding contact between the first and second surfaces of similar materials. The similar materials minimize the amount of friction created by inserting male portion 14 to the point along the line of insertion at which first and second sets of electrical contacts 30 and 32, respectively, mate with third and fourth sets of electrical contacts 44 and 46, respectively. The bulbous shape created by second sliding surface 45 can be exaggerated by, for example, narrowing the thickness of male portion 14, such as at point 52, to obtain mechanical advantage in prying the arm portions 20 apart. The bulbous shape and the angle of the arm portions 20 relative to the angle of insertion decrease the friction forces parallel to the first sliding surface 31 until the point where the second sliding surface 45 clears the contacts 30 and 32 where the arm portions 20 can move back toward each other, changing their relative angle to each other, becoming essentially parallel and increasing the amount of normal force to its maximum to wipe the contacts with respect to each other and to maintain electrical continuity in operation. Upon contact between all of the electrical contacts, a small amount of further movement indicated by dimension 58 positions and wipes and cleans the contacts of the first, second, third, and fourth sets of electrical contacts 30, 32, 44, and 46, respectively.

Upon removal of male portion 14, outer surface 45 of male portion 14 below center line 54 first contacts the surfaces at the first and second sets of electrical contacts 30 and 32, and then contacts outside layer 48 of female portion 12 above center line 56. It can be seen, therefore, that insertion and removal of male portion 14 with respect to female portion 12 is accomplished with a minimum amount of friction and without excessive wear to the electrical contacts or electrical conductors of the respective flexible circuitries.

In FIG. 1 it can be seen that male portion 14 is attached to a printed circuit board (daughter board 60). It is understood that male portion 14 may be integral with daughter board 60.

Also, the flexible circuitry tail end of the male portion is adapted to surface mount to the printed circuit board by reflow soldering or single point bonding. Because printed circuit boards are often not made to the precision of flexible circuitry, the design of the flexible circuitry tail end of the male portion can be made to flare out or to use a grid pattern of contacts, thus making alignment an easy match to the printed circuit board.

Figure 2:
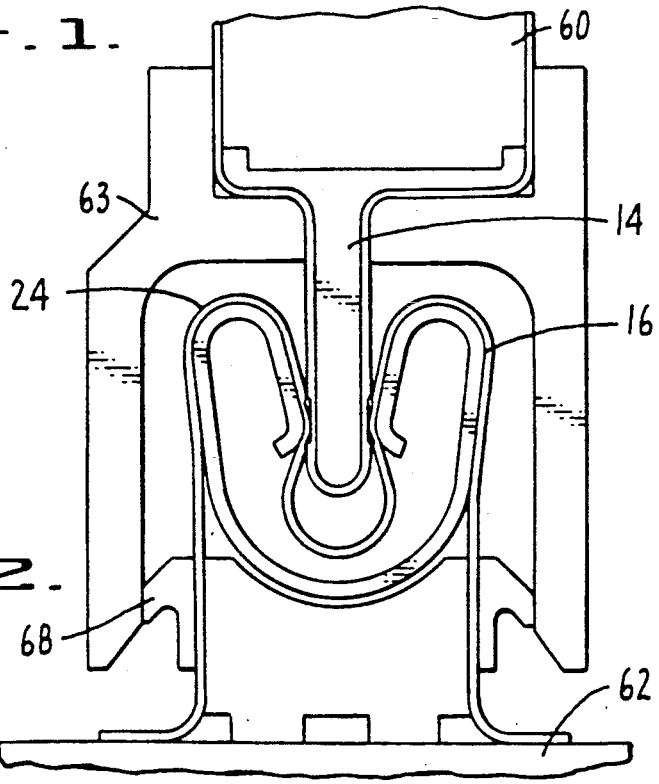
FIG. 2 is a cross-sectional view of the connector of the invention with the insertion member fully inserted and further including an environmental shield/housing.

In FIG. 2 it can be seen that flexible circuitry 24 may be electrically connected to a printed circuit board (mother board 62). Connector 10 of the invention is not limited by the particular means of electrical connection of flexible circuitry 24 to mother board 62, as various types of permanent connection are known in the art.

FIG. 1 illustrates an optional shape-memory alloy element 64 having a heater 66 positioned between shape-memory alloy element 64 and biasing member 16. Shape-memory alloy element 64 and heater 66 are of the type described fully in commonly-assigned U.S. Pat. No. 4,881,908 to Perry et al. which is incorporated herein by reference. It is understood that it is within the scope of the invention to heat shape-memory alloy element 64 by passing electrical current through it (resistance heating). This option would then create true zero insertion (make-break) forces but would still allow the low insertion force functions as desired.

FIGS. 6 and 7 illustrate the advantage of making the male contacts narrower than the female contacts (or vice versa). The narrower contact can misalign on the other contact by an amount $$\pm \frac{y-x}{2}$$

and still make full electrical contact between the elements.

Environmental and dust shield 63 (shown in FIG. 2) installed on the male member and sealing on a polymeric seal 68 on the female side is an optional feature of connector 10.

From the foregoing detailed description, it is evident that there are a number of changes, adaptations, and modifications of the present invention which come within the province of those skilled in the art. However, it is intended that all such variations not departing from the spirit of the invention be considered as being within the scope thereof and as being limited solely by the appended claims.

What is claimed is:

1. A high density multiple insertion connector comprising:
    a biasing member, said biasing member being elongated and having a longitudinal opening along the length thereof, said biasing member being generally C-shaped and having a center portion and arm portions having ends;
    flexible circuitry having first and second sets of parallel-spaced electrical conductors, at least a portion of said flexible circuitry mounted about said biasing member, said electrical conductors terminating in first and second sets of electrical contacts, said first set of contacts positioned on one side of said opening and said second set of contacts positioned on the other side of said opening, said first and second sets of electrical contacts positioned within the opening near but slightly spaced from the ends of said arm portions, the flexible circuitry near said first and second sets of electrical contacts having a first sliding surface, said biasing member and said flexible circuitry defining a female portion of the connector; and
    an insertion member, said insertion member being elongated and having a longitudinal edge for insertion into said opening, said insertion member having additional flexible circuitry on the surface thereof including third and fourth sets of parallel-spaced conductors, said third and fourth sets of conductors positioned on each side of said insertion member, said third and fourth sets of electrical conductors terminating in third and fourth sets of electrical contacts positioned adjacent to but spaced from the edge of said insertion member, the flexible circuitry near said third and fourth sets of electrical contacts having a second sliding surface, said first and second sliding surfaces being made of low friction material such that insertion or removal of the insertion member causes contact between said first and second surfaces, overcoming the bias of said biasing member to widen the opening further for insertion or withdrawal of the insertion member, said first and second surfaces undergoing a minimum of friction created by insertion and removal of the insertion member, further insertion movement of the insertion member positioning and wiping the contacts of said first, second, third, and fourth sets of electrical contacts with respect to each other into mating position, the insertion member defining a male portion of the connector.

2. A connector as in claim 1 wherein the first sliding surface extends primarily along the side of said first and second sets of contacts closest to the direction of insertion of said male portion.

3. A connector as in claim 1 wherein the arm portions of the biasing member extend outwardly from the center portion thereof.

4. A connector as in claim 1 wherein the arm portions of the biasing member extend outwardly and then bend and extend inwardly within the general C-shape of the biasing member.

5. A connector as in claim 1 including a shape-memory alloy element positioned within said biasing member, movement of said shape-memory alloy element overcoming said biasing member to open said connector.

6. A connector as in claim 1 wherein said insertion member is a separate component that may be affixed and electrically interconnected to the edge of a printed circuit board.

7. A connector as in claim 1 wherein said insertion member is integral with the edge of a printed circuit board.

8. A connector as in claim 1 wherein said first and second sets of contacts are of different width as compared to said third and fourth sets of contacts to allow for alignment mismatch.

9. A connector as in claim 1 wherein said second sliding surface extends primarily between said third and fourth sets of contacts around the longitudinal edge of said insertion member.

10. A connector as in claim 9 wherein said insertion member is generally bulbous in shape along said longitudinal edge in the area of said second sliding surface, the bulbous shape further reducing insertion force by increasing the angle of said arm portions upon initial insertion movement and increasing contact and wipe force upon further insertion movement.

* * * * *